United States Patent [19]
Youm et al.

[11] Patent Number: 6,147,033
[45] Date of Patent: Nov. 14, 2000

[54] APPARATUS AND METHOD FOR FORMING A FILM ON A TAPE SUBSTRATE

[75] Inventors: Do Jun Youm, Taejon; Doo Hoon Goo, Pusan; Sang Hyun Oh, Cheongju, all of Rep. of Korea

[73] Assignee: Korea Advanced Institute of Science and Technology, Taejon, Rep. of Korea

[21] Appl. No.: 09/407,892

[22] Filed: Sep. 29, 1999

[30] Foreign Application Priority Data

Sep. 30, 1998 [KR] Rep. of Korea ........................ 98-40739

[51] Int. Cl.[7] ................................................... C23C 14/00
[52] U.S. Cl. .................... 505/473; 427/255.5; 427/567; 118/712; 118/718; 118/719
[58] Field of Search .................... 118/718, 719, 118/712; 427/255.5, 567; 505/473

[56] References Cited

U.S. PATENT DOCUMENTS

| | | |
|---|---|---|
| 5,741,377 | 4/1998 | Goyal et al. . |
| 5,846,911 | 12/1998 | Freghardt .................... 505/434 |
| 5,863,336 | 1/1999 | Tkaczyk .................... 118/718 |

OTHER PUBLICATIONS

M. Paranthaman et al., *Growth of biaxially textured buffer layers on rolled–Ni substrates by electron beam evaporation*, Physica C, 275, (1997), pp. 266–272.

*Primary Examiner*—Richard Bueker
*Attorney, Agent, or Firm*—Oliff & Berridge, PLC

[57] ABSTRACT

This invention relates to an apparatus and method for forming a high temperature superconducting film on a tape substrate. In this invention, the superconducting film is deposited on the tape substrate wound around a cylindrical substrate holder inserted in an auxiliary chamber. The holder rotates during the whole deposition process. Vapors of film materials are supplied from a main chamber through an opening between the two chambers. According to the present invention, it is possible to form a highly uniform high temperature superconducting film on a tape substrate at high speeds suitable for large scale production. The manufacturing speed can easily be controlled by the size of the substrate holder.

13 Claims, 6 Drawing Sheets

APPARATUS AND METHOD FOR FORMING A FILM ON A TAPE SUBSTRATE

BACKGROUND OF THE INVENTION

1. Field of the Invention

The present invention relates to an apparatus and method for forming a film, more particularly to an apparatus and method for forming a high temperature superconducting film on a long tape substrate at high speeds suitable for large scale production.

2. Description of the Prior Art

A superconductor can carry high current without power loss because it has a property that the resistance is reduced to zero below a critical temperature. Therefore many studies have been made to use high temperature superconductors in applications such as power transmission lines and high field electromagnets. If the studies are commercially practiced, a big demand will be created in the marketplace of the various electromagnetic power devices. For this reason, most studies have been focused on manufacturing long flexible high temperature superconducting wires having high critical current densities in a large scale production.

However, recently the manufacture of high temperature superconducting tapes is also actively studied. Generally, there are two types of high temperature superconducting tapes according to the superconducting materials: Bismuth based ("Bi-type") high temperature superconducting material; and Yttrium based ("Y-type") high temperature superconducting material. The Bi-type material has proven to be easy to process since it retains good mechanical properties. The Y-type material is difficult to process but has an advantage that it is suitable for use in a high magnetic field. Bi-type high temperature superconducting materials have been studied intensively all over the world, but more recently Y-type high temperature superconducting materials are actively studied.

Unlike Bi-type high temperature superconducting materials (for example, $Bi_2Sr_2Ca_2Cu_3O_x$), Y-type high temperature superconducting materials including $Y_1Ba_2Cu_3O_{7-x}$ ("YBCO") have poor mechanical properties, so that Y-type superconducting tapes should be manufactured by methods different from those used in manufacturing Bi-type superconductor tapes. One of the methods of manufacturing YBCO superconductor tapes is to form a YBCO film on a tape substrate.

The tape substrate may be supplied in any conventional manner, shown in FIG. 6 as being unwound from a first spool 52. FIG. 6 is a schematic representation of a conventional "reel-to-reel" apparatus which is used in manufacturing a YBCO superconductor tape. Referring to FIG. 6, the first spool 52 continuously feeds the tape substrate toward deposition area 51 where the YBCO film is deposited. And then, the finished product, comprising the tape substrate and the YBCO film deposited thereon, is wound around a second spool 50.

FIG. 7 shows the deposition process performed by the "reel-to-reel" apparatus shown in FIG. 6. Referring to FIG. 7, a tape substrate is disposed to pass in proximity to vapors of superconduting materials when the tape substrate is moved horizontally in a direction of the arrow. The vapors are deposited on the tape and form a film. The portion A2 is deposited after the portion A1 has achieved its final deposition thickness. Thereafter, the portion A3 is deposited. That is, a YBCO superconducting film is produced by forming partially deposited portions continuously. In this process, at the locations, X (the edge of the vapor column) and Y (the center of the vapor column), the densities of vapor are so different that the parts of the film, being formed at that instance, at the two locations have different characteristics due to the different deposition rate. The lower layer in a part of the tape is deposited first when that part passes the location X, and then the upper layer of that part is deposited next when it passes the location Y later. Consequently, the film formed so is nonuniform in depth. The process has therefore an disadvantage that the deposited film is basically nonuniform.

Moreover, the deposition speed of this process has a serious limit since the deposition depends upon the moving speed of the tape substrate, which is determined by the size of vapor column times the deposition rate, where the former is few centimeter (same as the mean free path of the oxygen partial pressure) and the later is few nanometer thickness growth per minute (required for the epitaxial growth). The process is therefore not believed to be well suited for large scale production of superconductor tapes.

There can not be an over-emphasis of the importance of the film uniformity and the fabrication speed by the following reasons. If there is an insufficient superconducting quality at just one point over the whole length of few hundred meters long tape, that tiny defect will destroy the full super-current which flows along the whole length. The tape is so long that the fabrication speed per unit length should be enough fast.

Therefore, it is an object of the present invention to provide an apparatus and method, wherein a highly uniform high temperature superconducting film is formed on a tape substrate.

It is other object of the present invention to provide an apparatus and method for producing high temperature superconductor tapes at speeds suitable for large scale production.

SUMMARY OF THE INVENTION

The above objects of the present invention are achieved in an apparatus and method involving continuously depositing a superconducting film on a long tape substrate wound around a cylindrical winding means.

The apparatus of the present invention comprises a main vacuum chamber and an auxiliary chamber where their inner spaces are connected by a common opening. A long tape substrate is wound around a cylindrical substrate holder which is inserted in the auxiliary chamber and rotated by a motor. The rotation speed is several turns per second. In the main chamber, the superconductor materials is vaporized and supplied to the tape substrate through the opening so as to be deposited on the tape substrate.

The apparatus of the present invention may further comprise means for rotating the cylindrical substrate holder on its axis.

The cylindrical substrate holder preferably has a side surface with a continuous spiral groove formed thereon.

The auxiliary chamber is preferably connected to a gas feeding pipe to keep the inside of it in a predetermined gas ambient, for example oxygen ambient.

Preferably, the apparatus further comprises means for heating the tape substrate and measuring its temperature.

More preferably, the apparatus comprises means for monitoring the deposition rate on the tape substrate.

The method of the present invention comprises the steps of: inserting the cylindrical substrate holder into the auxiliary chamber after winding the tape substrate around the substrate holder; removing impurities and natural oxide layer from the tape substrate; forming a buffer layer on the tape substrate to prevent the constituents of the tape substrate from permeating the film to be deposited; and depositing a film on the tape substrate by evaporating film material through the opening while rotating the substrate holder.

The superconducting materials and also their vapors may comprise Yttrium, Barium and Copper to form a YBCO superconductor film on the tape substrate.

The key ideas of present invention are as following; (1) In order to achieve the uniformity, the whole tape is wound on a large cylindrical substrate holder without any folding through the whole length of the tape and the holder rotates several turns per a second so that the whole surface the tape is exposed to the vapor at the same time. Hence, the depositions at any areas of the whole tape are performed simultaneously. Consequently, the whole film is uniform. The local equivalence of deposition at any parts in depth as well as in length guarantees the uniformity. (2) The big advantage of this method is high speed of fabrication due to the simultaneous deposition on the whole film. All the deposition process can be finished within the time same as that taken for deposition of any small size of film. Since the diameter of the cylindrical holder for winding a 300 m long tape is 1 m, the vacuum of the main chamber must be less than $10^{-4}$ Torr so that the mean free path is larger than 1 m for a homogeneous flow of vapor. And the oxygen pressure is required to be higher than $10^{-2}$ Torr for proper formation of YBCO superconducting film. In order to satisfy these two different gas pressure, the system must be divided into the two chambers where the oxygen pressure is high in the auxiliary one and low in the main one.

BRIEF DESCRIPTION OF THE DRAWINGS

These and other features of the present invention and the attendant advantages will be readily apparent to those having ordinary skill in the art and the invention will be more easily understood from the following detailed description of the preferred embodiments of the present invention taken in conjunction with the accompanying drawing wherein.

DETAILED DESCRIPTION OF THE PREFERRED EMBODIMENTS

Figure 1:
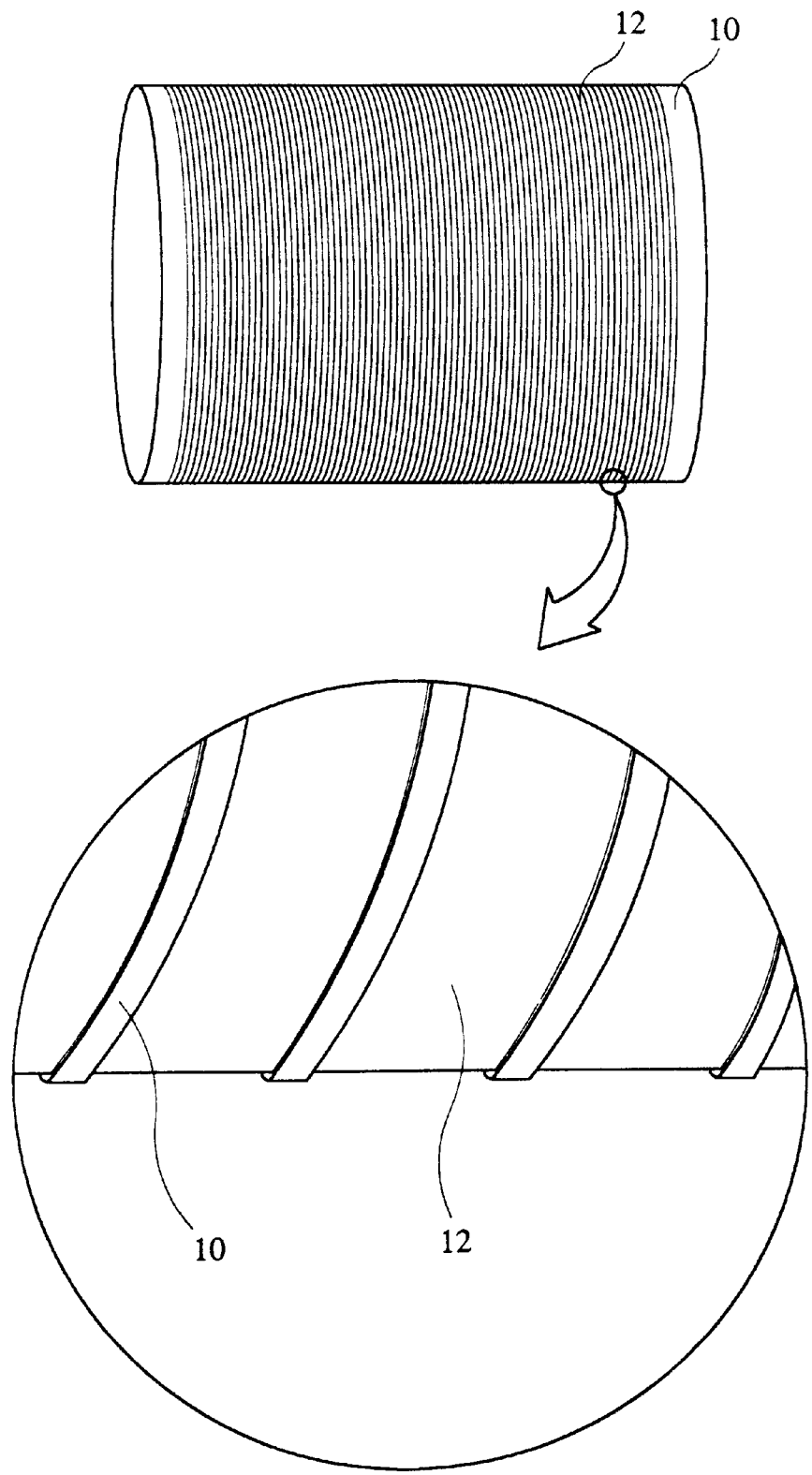
FIG. 1 shows the structure of a cylindrical substrate holder, which is used in an apparatus according to one embodiment of the present invention, and the tape substrate wound around the holder.

FIG. 1 shows the structure of a substrate holder which is used in an apparatus according to one embodiment of the present invention Referring initially to FIG. 1, a substrate holder 10 takes a cylindrical shape of radius 1 m and length 2 m. The holder 10 is made of stainless steel. A continuous spiral groove is formed on the side surface of the holder 10 to wind a tape substrate 12 therein. The groove has a depth of 0.2 mm and a width of 10 mm. Calculating from the size of the holder 10, it is to be understood that about 300 m tape substrate 12 is wound around the holder 10.

Figure 2:
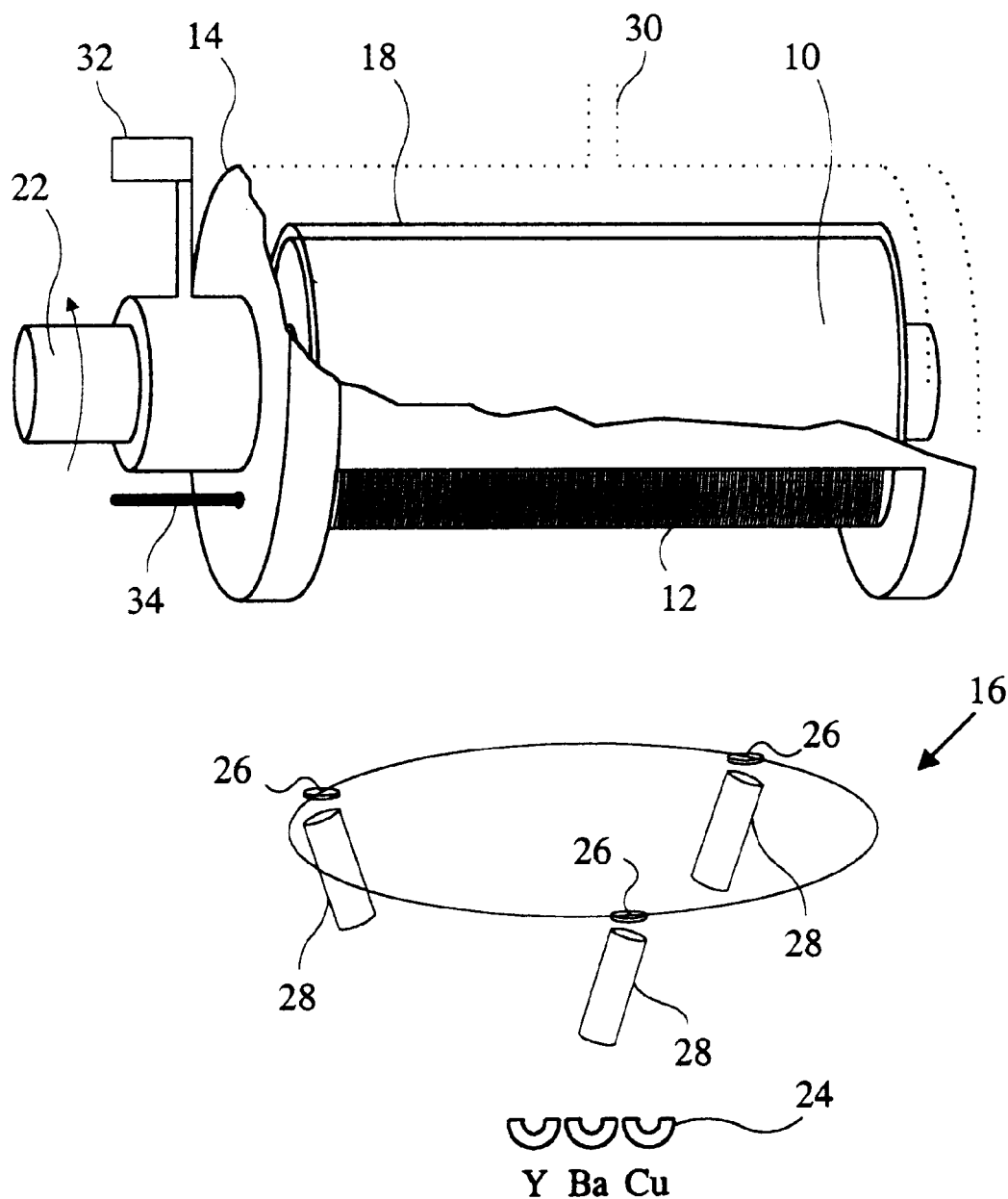
FIG. 2 schematically illustrates the process of a film formation by an apparatus of the present invention.

FIG. 2 schematically illustrates the process of a film formation by an apparatus of the present invention, particularly of a coevaporation main chamber for evaporation of YBCO materials.

Figure 3A:
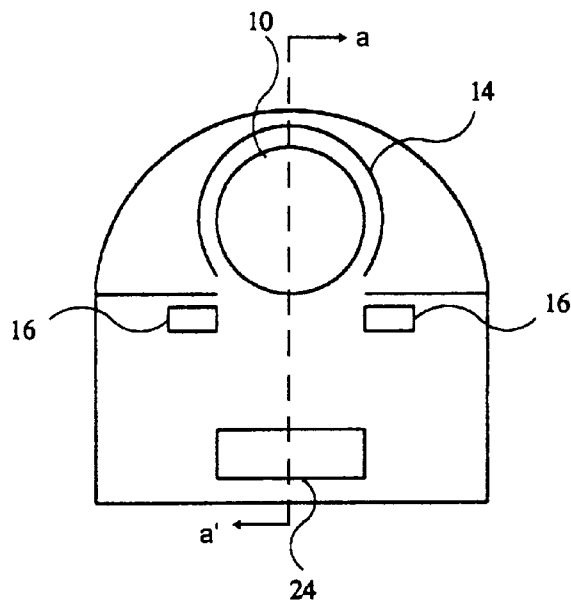
FIG. 3A is a sectional side view of an apparatus of the present invention.
Figure 3B:
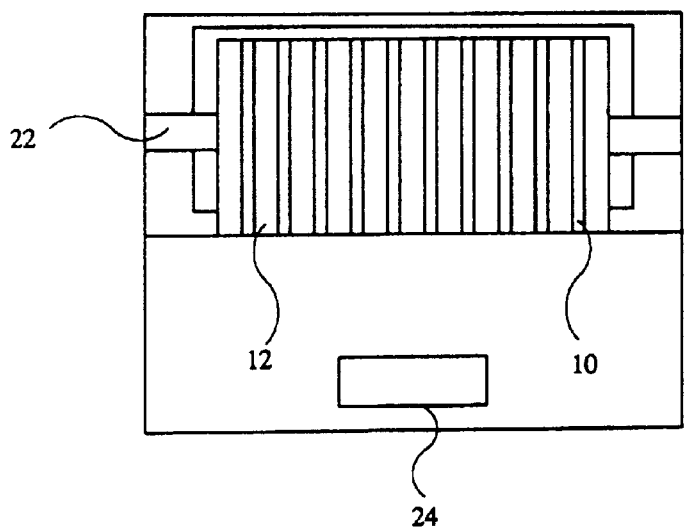
FIG. 3B is a view of the apparatus of FIG. 3A at section a–a'.

FIG. 3A is a sectional side view of an apparatus of the present invention and FIG. 3B is a view of the apparatus of FIG. 3A at section a–a'.

Referring to FIG. 2–FIG. 3B, an auxiliary chamber is connected to a main chamber. Their inner spaces are connected by a common opening. The vapors of the film materials can pass through the opening. The width of the opening is 1 m. The cylindrical substrate holder 10 shown in FIG. 1 is inserted into the auxiliary chamber 14. A tape substrate 12 is wound around the holder 10 without any folding in its whole length. A heater 18 surrounds the holder 10 with the exception of the opening portion. For the uniform deposition on the tape substrate 12, the holder 10 is rotated by few turns per a second. A shaft 22 rotates to impart rotational movement to the holder 10.

In the main chamber, reagent supply means 16 supplies vapors of the film materials through the opening. Reagent supply means 16 comprises a reagent heating means (not shown) and a plurality of boats 24 containing thin film materials therein. In this embodiment, Yttrium, Barium and Copper are contained in three boats 24 as reagents for forming a YBCO superconducting film. The boats 24 are made of Tantalum or Molybdenum.

A deposition rate monitoring sensor is installed in the main chamber. The thickness of the film deposited on the tape substrate 12 can be monitored indirectly using thickness monitoring means 16. The monitoring means 16 includes reagent conduits 28 for guiding evaporated reagents to the outside of the opening, and thickness monitoring substrates 26 located at the exits of the conduits 28. The circle around the substrates 26 represents a minimum radius to locate the thickness monitoring means 16 outside the opening.

Ambient gases are fed into the auxiliary chamber 14 through a gas feeding pipe 30. Hydrogen-argon mixed gas is used when removing impurities on the tape substrate, and oxygen when forming a YBCO superconductor thin film.

The pressure and temperature inside the auxiliary chamber 14 are measured by a pressure gauge 32 and a thermocouple 34, respectively.

Hereinafter, the method of forming a high temperature superconducting film according to another aspect of the present invention will be described in detail. The method is performed using the apparatus described in FIG. 2–FIG. 3B.

A nickel tape substrate used in this method is prepared using RABiTS (Rolling Assisted Biaxially Textured Substrate) technique. In this technique, nickel is rolled to a thickness of 0.12 mm, and thereafter heated for recrystallization at 1100° C. for 10 hours.

The cylindrical substrate holder 10 is inserted into the auxiliary chamber 14 after the tape substrate 12 is wound around the substrate holder 10.

And then, the holder 10 is rotated while the tape substrate 12 is heated during the whole process. Buffer layers are deposited before YBCO film deposition to enhance the effects of impurity removal and film deposition.

In the step of removing impurities or a natural oxide layer on the tape substrate 12, the inside of the auxiliary chamber 14 is maintained at a temperature of 700° C. and at a pressure of 500 mTorr. In this step, hydrogen-argon mixed gas is supplied to the auxiliary chamber 14 for 30 minutes.

Thereafter, a CeO2 buffer layer is formed on the tape substrate 12 to prevent the constituents of the tape substrate 12 from permeating the thin film to be deposited thereon. Preferably, a CeO2 buffer layer of approximately 1000 Å thickness is deposited at a rate of 1 Å/sec while heating the inside of the auxiliary chamber to 700° C. at a base pressure of $6 \times 10^{-6}$ Torr.

After the deposition of the CeO2 layer, a YSZ (Yttria Stabilized Zirconia) layer of 1000 Å thickness is formed at a rate of 1 Å/sec using in-situ electron beam evaporation method. In this step, hydrogen-argon mixed gas is supplied to the auxiliary chamber at a base pressure of $6 \times 10^{-7}$ Torr.

Thereafter, a YBCO film of 2000 Å thickness is formed on the tape substrate 12 exposed by the opening of the auxiliary chamber 14.

Figure 4:
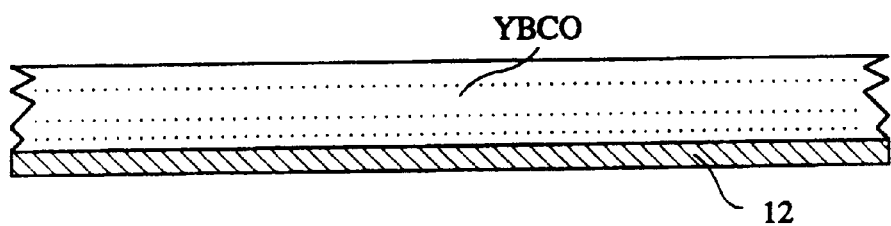
FIG. 4 illustrates a sample that a YBCO superconductor thin film is deposited on a tape substrate.

FIG. 4 illustrates a sample that a YBCO superconductor film is deposited on a tape substrate. The film is made of many atomic layers. The lowest atomic layer for the whole length of tape is deposited first, and the next lowest atomic layer for the whole length of tape is deposited. The repetition of the same process for every atomic layer completes the film with the final thickness. Referring to this process, it is understood that the deposited thin film is highly uniform. The thin film of the sample was subjected to measurement of an X-ray diffraction and analysis of the composition.

Figure 5A:
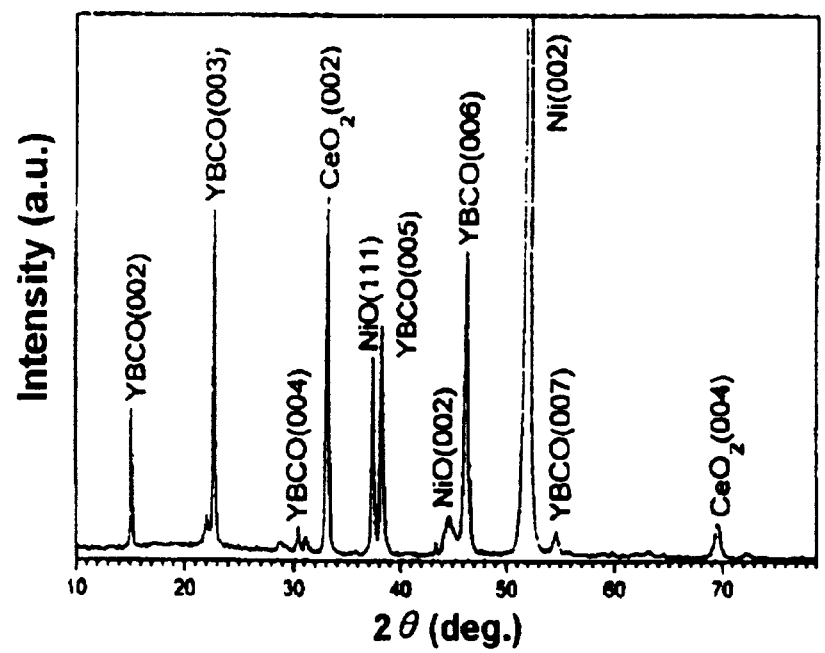
FIGS. 5A to 5C show the properties of the YBCO superconductor thin film deposited using the method of the present invention.
Figure 5B:
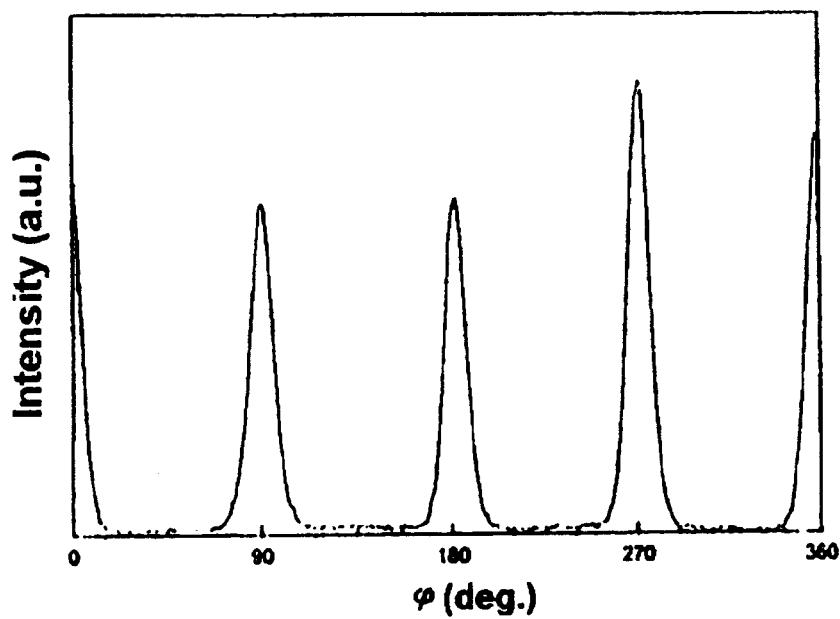

FIGS. 5A and 5B are X-ray diffraction θ−2θ and φ scan patterns of the sample, respectively. Referring to FIGS. 5A and 5B, the X-ray diffraction patterns show the deposited thin film is oriented in the direction perpendicular to the C-axis and its ab-plane is well-aligned.

Figure 5C:
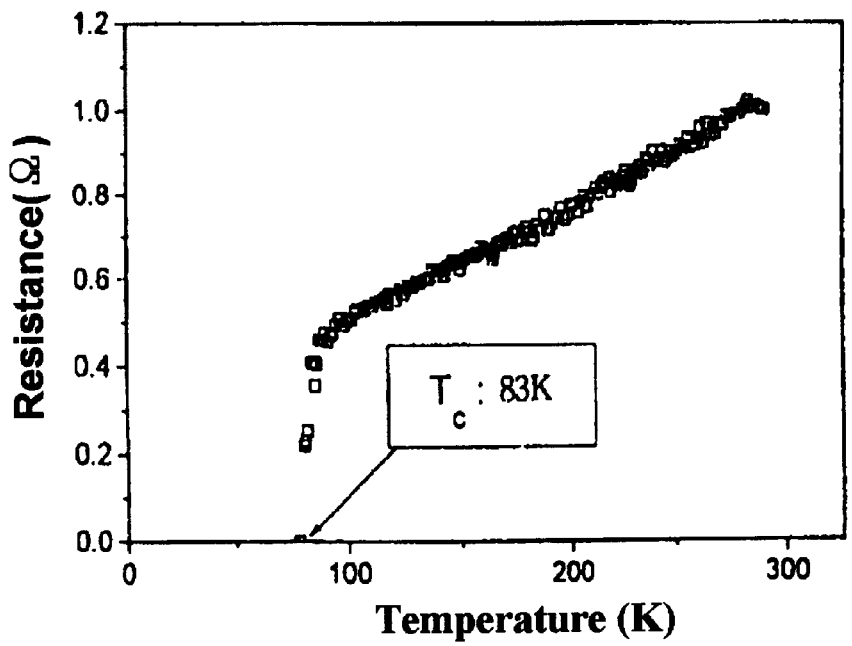
Figure 6:
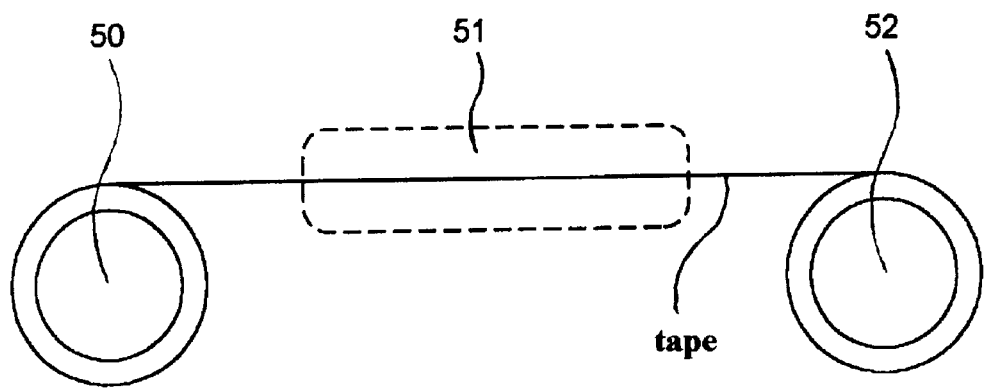
FIG. 6 is a schematic representation of a conventional "reel-to-reel" apparatus which is used in depositing a YBCO superconductor thin film.
Figure 7:
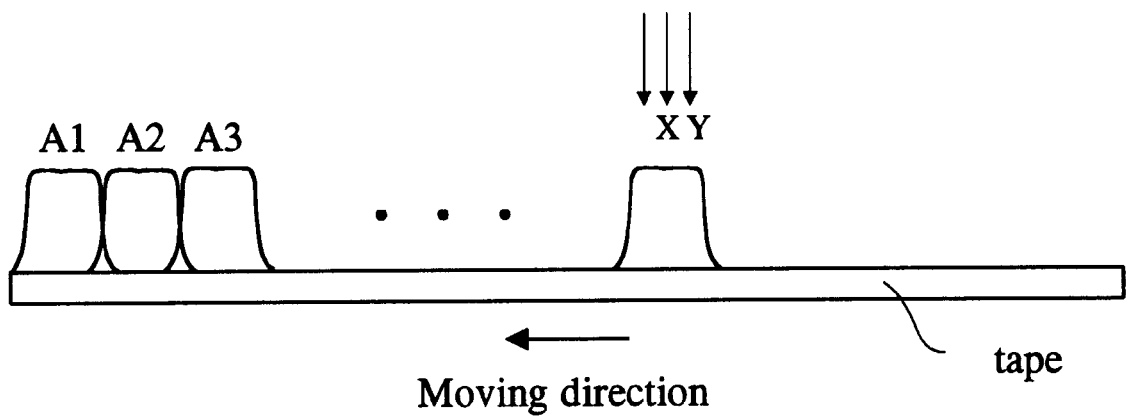
FIG. 7 illustrates the process of a film formation by the apparatus shown in FIG. 6.

FIG. 5C is a graph showing the resistance versus the temperature of the sample. From FIG. 5C, it is apparent that the critical temperature is 77 K. The result of electrical testing showed that the critical current density was about $10^6 A/cm^2$ at a temperature of 77 K.

According to the present invention, it is possible to form a highly uniform high temperature superconducting film on a tape substrate at high speeds suitable for large scale production. The manufacturing speed can easily be controlled by the size of the substrate holder.

What is claimed is:

1. Apparatus for forming a film on a tape substrate, comprising:

a main vacuum chamber;

an auxiliary chamber having an opening to the main chamber;

means for winding a tape substrate of continuous length, the winding means being inserted into the auxiliary chamber; and means for supplying vapors of film materials to the tape substrate through the opening.

2. The apparatus of claim 1, wherein the winding means takes a cylindrical shape with a side surface having a spiral groove formed thereon to wind the tape substrate.

3. The apparatus of claim 2, further comprising means for rotating the cylindrical winding means on its axis.

4. The apparatus of claim 1, wherein the auxiliary chamber is connected to a gas feeding pipe to keep the inside of the auxiliary chamber in a predetermined gas ambient.

5. The apparatus of claim 4, wherein the predetermined gas is oxygen.

6. The apparatus of claim 5, wherein the film materials comprise Yttrium, Barium and Copper.

7. The apparatus of claim 1, further comprising means for measuring the temperature inside auxiliary chamber.

8. The apparatus of claim 1, further comprising means for monitoring the thickness of the film deposited on the tape substrate.

9. A method for forming a film on a tape substrate, using an apparatus comprising a main chamber, an auxiliary chamber having an opening to the main chamber, means for winding a tape substrate which takes a cylindrical shape, and means in the main chamber for evaporation of film materials, the method comprising the steps of:

inserting the winding means into the auxiliary chamber after winding the tape substrate thereon;

removing impurities and natural oxide layer from the tape substrate;

forming a buffer layer on the tape substrate to prevent the constituents of the tape substrate from permeating the film to be deposited; and depositing a film on the tape substrate by evaporating at least one film material through the opening while rotating the winding means.

10. The method of claim 9, wherein the step of removing impurities proceeds in hydrogen-argon mixed gas ambient while keeping the temperature and pressure inside the auxiliary chamber in the range of 600° C.–800° C. and 300–700 mTorr, respectively.

11. The method of claim 10, wherein the tape substrate is made of textured Nickel, and the buffer layer is composed of a CeO2 layer and a YSZ layer formed thereon.

12. The method of claim 11, wherein the step of forming a buffer layer is comprised of the steps of:

forming a CeO2 layer on the Nickel substrate using electron beam evaporation method employing Ce metal as a source; and forming a YSZ layer on the CeO2 layer using in-situ electron beam evaporation method.

13. The method of claim 12, wherein the at least one film material comprises Yttrium, Barium and Copper.

* * * * *